United States Patent
Izumi et al.

(10) Patent No.: US 7,981,787 B2
(45) Date of Patent: Jul. 19, 2011

(54) SEMICONDUCTOR DEVICE MANUFACTURING METHOD

(75) Inventors: Takayuki Izumi, Tokyo (JP); Ryoji Shigemasa, Tokyo (JP); Tomoyuki Ohshima, Tokyo (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/461,577

(22) Filed: Aug. 17, 2009

(65) Prior Publication Data

US 2010/0048016 A1    Feb. 25, 2010

(30) Foreign Application Priority Data

Aug. 20, 2008  (JP) ................. 2008-211747

(51) Int. Cl.
*H01L 21/28* (2006.01)
*H01L 21/3205* (2006.01)

(52) U.S. Cl. . 438/604; 438/167; 438/705; 257/E21.407; 257/E21.219

(58) Field of Classification Search ........... 438/705, 438/604, 167; 257/E21.407, E21.126, E21.403, 257/E21.219; 216/40
See application file for complete search history.

(56) References Cited

U.S. PATENT DOCUMENTS

| 5,844,260 A * | 12/1998 | Ohori ............................ 257/190 |
| 7,012,286 B2 * | 3/2006 | Inai et al. ....................... 257/192 |
| 7,705,377 B2 * | 4/2010 | Ohshima ........................ 257/284 |
| 2004/0082158 A1 * | 4/2004 | Whelan et al. ................ 438/606 |

FOREIGN PATENT DOCUMENTS

| EP | 0209194 | * | 1/1987 |
| JP | 08-162647 A | | 6/1996 |
| JP | 11-054837 A | | 2/1999 |
| JP | 2007-157918 A | | 6/2007 |

OTHER PUBLICATIONS

Takehiko Kato et al., "Low Voltage Operation Power Heterojunction FET with Low on-resistance for Personal Digital Cellular Phones" Technical Report of IEICE (The Institute of Electronics, Information and Communication Engineers) ED98-215, MW98-178, ICD98-282 (Jan. 1999).

* cited by examiner

*Primary Examiner* — Caridad M Everhart
(74) *Attorney, Agent, or Firm* — Rabin & Berdo, PC

(57) ABSTRACT

A semiconductor device manufacturing method includes: providing a laminated member in which at least a first GaAs layer, an InAlGaAs layer and a second GaAs layer are laminated on or above a substrate in this order; and etching the second GaAs layer using the InAlGaAs layer as an etching stopper layer. A ratio of In:Al of the InAlGaAs layer is in a range of approximately 4:6 to approximately 6:4 and a ratio of (In+Al):Ga of the InAlGaAs layer is in a range of approximately 1.5:8.5 to approximately 5:5.

4 Claims, 7 Drawing Sheets

SEMICONDUCTOR DEVICE MANUFACTURING METHOD

CROSS-REFERENCE TO RELATED APPLICATION

This application claims priority under 35 USC 119 from Japanese Patent Application No. 2008-211747 filed on Aug. 20, 2008, the disclosure of which is incorporated by reference herein.

BACKGROUND OF THE INVENTION

1. Field of the Invention

The present invention relates to a manufacturing method for a semiconductor device, and more particularly, to a manufacturing method for a semiconductor device in order to acquire a HEMT (High electron mobility transistor) or a MESFET (Metal-Semiconductor Field Effect Transistor), for example.

2. Description of the Related Art

Hitherto, a semiconductor device has been proposed which has a structure having a through hole called recess in a contact layer and having a gate electrode therein (as in Japanese Patent Application Laid-Open (JP-A) No. 2007-157918, for example).

On the other hand, one semiconductor device may have a double recess structure having a small through hole called inner recess within a through hole called wide recess, and having a gate electrode imbedded in the small through hole and also disposed on the edge part thereof (refer to "Low Voltage Operation Power Heterojunction FET with Low on-resistance for Personal Digital Cellular Phones", TECHNICAL REPORT OF IEICE (The Institute of Electronics, Information and Communication Engineers) ED98-215, MW98-178, ICD98-282 (1999-01), for example). The semiconductor device has an etching stopper layer for performing selective etching. For example, generally in a conventional InGaAs/AlGaAs (GaAs) semiconductor device, in order to use an organic acid-oxygenated water mixed solution or a $BCl_3/SF_6$ mixed gas to perform selective etching between two GaAs layers or two AlGaAs layers, an AlGaAs layer having a higher mixing ratio of Al (approximately 20% or higher) or an AlAs layer is used as an etching stopper layer.

However, because the AlGaAs layer with the higher mixing ratio of Al or AlAs layer as an etching stopper layer has a larger band gap than that of a GaAs layer or an InGaAs layer, conduction band discontinuity increases. The conduction band discontinuity becomes a barrier against electrons, which increases the contact resistance, for example, and results in a device with a larger parasitic resistance.

By the way, as a technology for reducing the contact resistance, methods for lowering the barrier at an interface between layers have been proposed (refer to JP-A Nos. 8-162647, 11-54837 and 2007-157918 for example). However, from the viewpoint of the implementation of etching with high precision, the methods are still not enough, and improvements thereon are being demanded today.

SUMMARY OF THE INVENTION

Accordingly, it is an object of the present invention to provide a manufacturing method for a semiconductor device, which allows, using an etching stopper layer, performing selective etching with high precision between two GaAs layers or two AlGaAs layers and suppressing the increase in contact resistance.

According to a first aspect of the present invention, there is provided a semiconductor device manufacturing method, comprising:

providing a laminated member in which at least a first GaAs layer, an InAlGaAs layer and a second GaAs layer are laminated on or above a substrate in this order; and etching the second GaAs layer using the InAlGaAs layer as an etching stopper layer, wherein a ratio of In:Al of the InAlGaAs layer is in a range of approximately 4:6 to approximately 6:4 and a ratio of (In+Al):Ga of the InAlGaAs layer is in a range of approximately 1.5:8.5 to approximately 5:5.

According to a second aspect of the present invention, there is provided a semiconductor device manufacturing method, comprising:

providing a laminated member in which at least an AlGaAs electron donating layer or an AlGaAs Schottky layer, a GaAs gate-buried layer, an InAlGaAs etching stopper layer, and a GaAs contact layer are laminated on or above a substrate in this order;

etching the GaAs contact layer to form a first through hole;

etching the InAlGaAs etching stopper layer to form a second through hole having an approximately same size as the first through hole;

etching the GaAs gate-buried layer to form a third through hole in the first and second through holes, the third through holes being smaller than the first through hole; and forming an electrode in the first and second thorough holes, wherein a ratio of In:Al of the InAlGaAs etching stopper layer is in a range of approximately 4:6 to approximately 6:4 and a ratio of (In+Al):Ga of the InAlGaAs etching stopper layer is in a range of approximately 1.5:8.5 to approximately 5:5.

According to a third aspect of the present invention, there is provided a semiconductor device manufacturing method, comprising:

providing a laminated member in which at least a first AlGaAs layer, an InAlAs layer and a second AlGaAs layer are laminated on or above a substrate in this order; and etching the second AlGaAs layer using the InAlAs layer as an etching stopper layer, wherein a ratio of In:Al of the InAlAs layer is in a range of approximately 4:6 to approximately 6:4.

According to a fourth aspect of the present invention, there is provided a semiconductor device manufacturing method, comprising:

providing a laminated member in which at least an AlGaAs electron donating layer or an AlGaAs Schottky layer, an InAlGaAs etching stopper layer, an AlGaAs gate-buried layer, and a GaAs contact layer are laminated on or above a substrate in this order;

etching the GaAs contact layer to form a first through hole;

etching the AlGaAs gate-buried layer to form a second through hole in the first through hole, the second through hole being smaller than the first through hole;

etching the InAlAs etching stopper layer to form a third through hole having an approximately same size as the second through hole; and filling the second and third through holes in the first through hole to form an electrode, wherein a ratio of In:Al of the InAlGaAs etching stopper layer is in a range of approximately 4:6 to approximately 6:4.

BRIEF DESCRIPTION OF THE DRAWINGS

Exemplary embodiments of the present invention will be described in detail based on the following figures, wherein.

DETAILED DESCRIPTION

Figure 1:
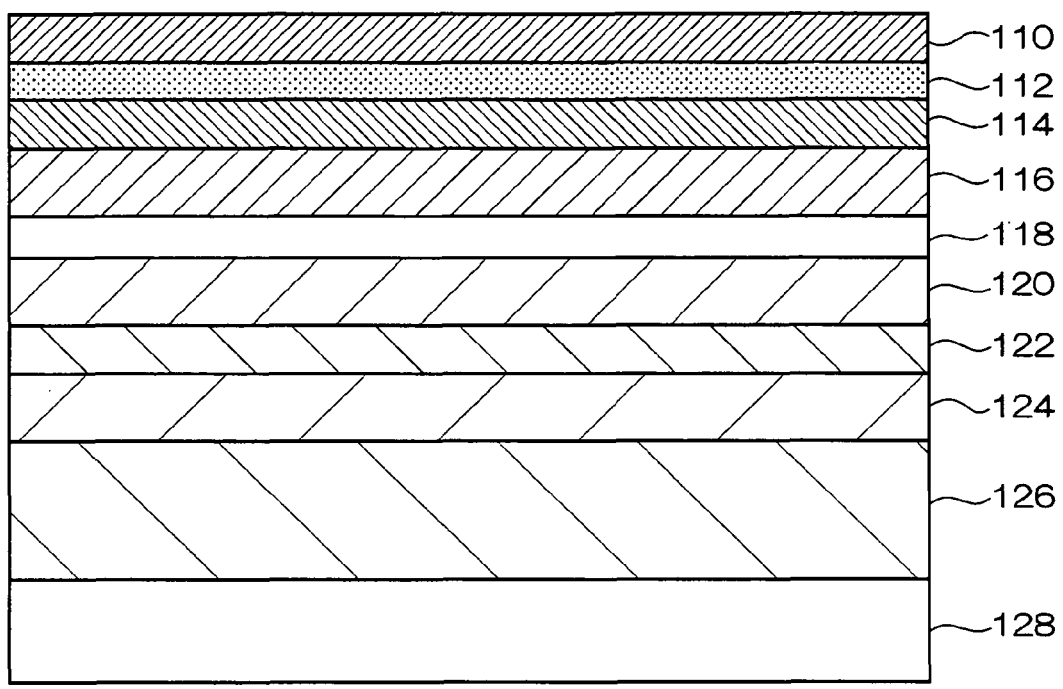
FIG. 1 is a schematic cross-sectional view for explaining a manufacturing process for a semiconductor device according to a first embodiment.

With reference to drawings, preferred embodiments of the present invention will be described below. The same reference numerals are given to those having substantially the same functions throughout all drawings for explanation, and descriptions thereon may be omitted in some cases.

First Embodiment

Referring to FIGS. 1 and 2, a manufacturing method for a semiconductor device according to a first embodiment will be explained.

The manufacturing method for the semiconductor device according to the first embodiment is a method for manufacturing an AlGaAs/InGaAs HEMT with a double recess structure, for example.

First of all, more specifically, as shown in FIG. 1, vapor deposition is used to form epitaxial layers on a GaAs substrate 128. The epitaxial layers are formed by epitaxial growth to include, from the uppermost layer side, an n-GaAs contact layer 110 (500 Å thick, which is a second GaAs layer), an $In_{0.2}Al_{0.2}Ga_{0.6}As$ etching stopper layer 112 (100 Å thick, which will be called InAlGaAs etching stopper layer 112 below), an undoped-GaAs gate buried layer 114 (200 Å thick, which is a first GaAs layer), an n-AlGaAs electron donating layer 116 (250 Å thick), an undoped-$Al_{0.25}Ga_{0.75}As$ spacer layer 118 (30 Å thick), an $In_{0.2}Ga_{0.8}As$ channel layer 120 (100 Å thick), an undoped-$Al_{0.25}Ga_{0.75}As$ spacer layer 122 (50 Å thick), an n-$Al_{0.25}Ga_{0.75}As$ electron donating layer 124 (70 Å thick), and an undoped-$Al_{0.25}Ga_{0.75}As$ buffer layer 126 (2000 Å thick). The n-AlGaAs electron donating layer 216 is a layer functioning both as an electron donating layer and a Schottky layer.

Figure 2A:
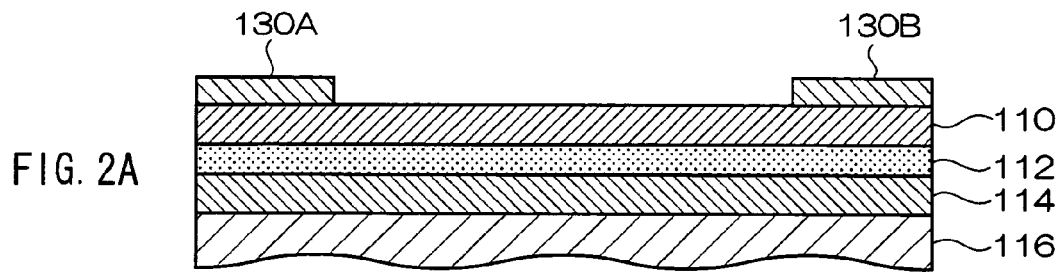
FIGS. 2A to 2E are process charts for explaining the manufacturing process for the semiconductor device according to the first embodiment.

Next, as shown in FIG. 2A, vacuum evaporation and/or the sputtering method is used to form two ohmic electrodes on the n-GaAs contact layer 110, which are used as a source electrode 130A and a drain electrode 130B.

Figure 2B:
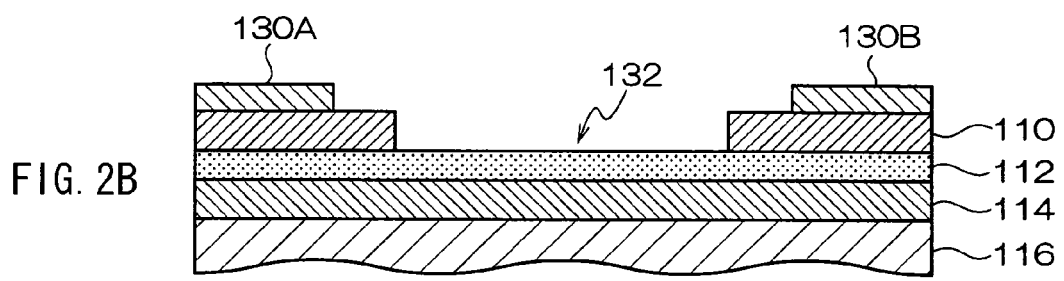

Next, as shown in FIG. 2B, photolithography is used to provide a photoresist (not shown) having an opening pattern on the n-GaAs contact layer 110. Then, selective etching using a mixed solution (etchant) of tri-ammonium citrate, oxygenated water and water is performed on the n-GaAs contact layer 110 between the source electrode 130A and the drain electrode 130B to form a wide recess 132 (which is a first through hole). The mixing ratio of the mixed solution (etchant) is, for example, tri-ammonium citrate salt/25 g:oxygenated water/40 cc:water/2000 cc.

In the etching process, the InAlGaAs etching stopper layer 112 is little etched because the etching rate of the n-GaAs contact layer 110 is about 1000 Å/min while the etching rate of the InAlGaAs etching stopper layer 112 is 10 Å/min or lower, for example. Therefore, the InAlGaAs etching stopper layer 112 stops the etching.

Figure 2C:
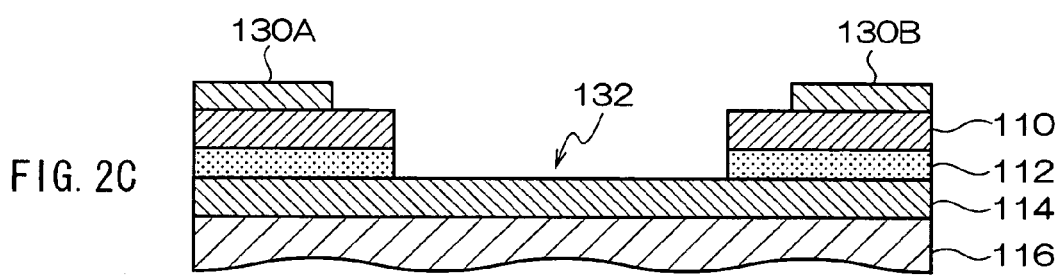

Next, as shown in FIG. 2C, by keeping the photoresist, a mixed solution (which is an etchant a nonselective etchant) of phosphoric acid, oxygenated water and water, for example, is used to perform nonselective etching (uniform etching) on the InAlGaAs etching stopper layer 112, whereby making a wide recess 132 reach the undoped-GaAs gate buried layer 114. The mixing ratio of the mixed solution (etchant) is phosphoric acid/100 cc:oxygenated water/5 cc:water/2100 cc. The depth of the wide recess 132 as a result of the etching on the InAlGaAs etching stopper layer 112 corresponds to a second through hole.

The etching is not required to reach the undoped-GaAs gate buried layer 114, but the etching may be stopped on the way. Then, after a photoresist (not shown) for forming an inner recess 134, which will be described later, is provided, the InAlGaAs etching stopper layer 112 remaining on the undoped-GaAs gate buried layer 114 may be removed by etching.

Figure 2D:
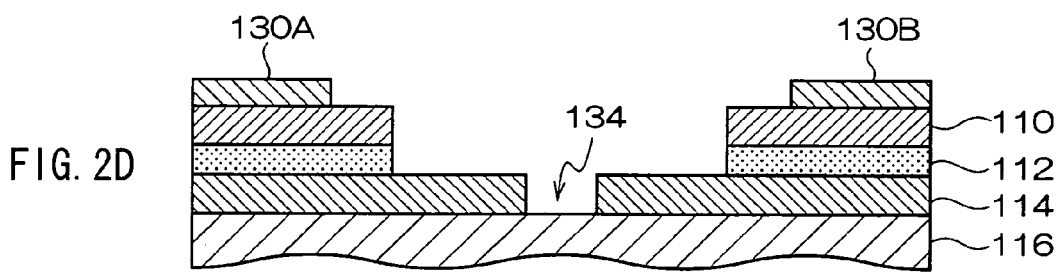

Next, as shown in FIG. 2D, photolithography is used to provide a photoresist (not shown) having an opening pattern both on the n-GaAs contact layer 110 and on the undoped-GaAs gate buried layer 114 exposed by the wide recess 132. Then, by performing selective etching, the inner recess 134 (which is a third through hole), which is smaller than the wide recess 132, is formed within the wide recess 132. The selective etching stops at the n-AlGaAs electron donating layer 116.

Figure 2E:
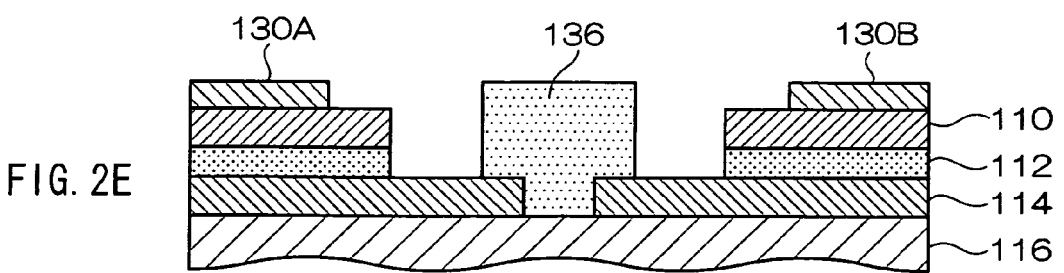

Next, as shown in FIG. 2E, aluminum (Al) of 5000 Å thick is deposited using vacuum evaporation or sputtering, for example, and then the aluminum is lifted off to form a gate electrode 136, which is imbedded in the inner recess 134 and is also formed on the edge part of the inner recess 134 of the undoped-GaAs gate buried layer 114 (that is, on the undoped-GaAs gate buried layer 114 around the opening part of the inner recess 134).

In this way, the AlGaAs/InGaAs HEMT with a double recess structure is manufactured.

In the manufacturing method for the semiconductor device according to this embodiment which has been described above, the InAlGaAs layer (which is the InAlGaAs etching stopper layer 112) is provided between the two GaAs layers (which is the n-GaAs contact layer 110 and the undoped-GaAs gate buried layer 114).

In addition, in this embodiment, the $In_{0.2}Al_{0.2}Ga_{0.6}As$ layer is used as the InAlGaAs layer functioning as an etching stopper layer. A ratio of In:Al of the InAlGaAs etching stopper layer is preferably in a range of 4:6 to 6:4, and a ratio of (In+Al):Ga of the InAlGaAs etching stopper layer is preferably in a range of 1.5:8.5 to 5:5.

Because the InAlGaAs layer functioning as the etching stopper layer has a sufficiently low etching rate with respect to the n-GaAs contact layer 110 (which is the second GaAs layer), the InAlGaAs layer can fully exhibit the function as an etching stopper layer.

On the other hand, the InAlGaAs layer as an etching stopper layer has a sufficiently low barrier against the GaAs layers (which are the n-GaAs contact layer 110 and the undoped-GaAs gate buried layer 114) in the conduction of electrons, which can suppress the increase in contact resistance.

Here, an InAlGaAs layer containing In can have a sufficiently low barrier against an GaAs layer. However, because an InAlGaAs layer is a nonlattice matching layer, a threshold thickness at which dislocation does not occur (that is, the upper limit of thickness with which a layer having lattice matching as a result of epitaxial growth with good crystal can be obtained) exists and depends on a degree of mismatching with the lattice constant of a base. Therefore, the composition and thickness may not be selected freely. For example, according to this embodiment, the $In_{0.2}Al_{0.2}Ga_{0.6}As$ layer has a composition ratio of In of 20% (In+Al+Ga=100%). The threshold thickness in this case is about 130 Å. As the composition ratio of In increases, the contact resistance decreases with respect to the GaAs layer. On the other hand, because the threshold thickness decreases, the thickness providing the sufficient function as an etching stopper layer may not be obtained. Therefore, in this embodiment, the InAlGaAs layer having the above-mentioned predetermined composition ratio allows lattice matching and can be formed in thickness allowing the sufficient function as an etching stopper layer (more specifically, such as 100 Å or thicker), and the contact resistance can be reduced.

Therefore, the InAlGaAs layer having the above-mentioned predetermined composition can be used as an etching stopper layer to perform selective etching with high precision between two GaAs layers and can suppress the increase in contact resistance. As a result, the etching depth can be controlled with high precision, and a device with a low parasitic resistance (more specifically, such as a device with a low parasitic resistance between the n-GaAs contact layer 110 and the n-AlGaAs electron donating layer 116) can be obtained.

Figure 3:
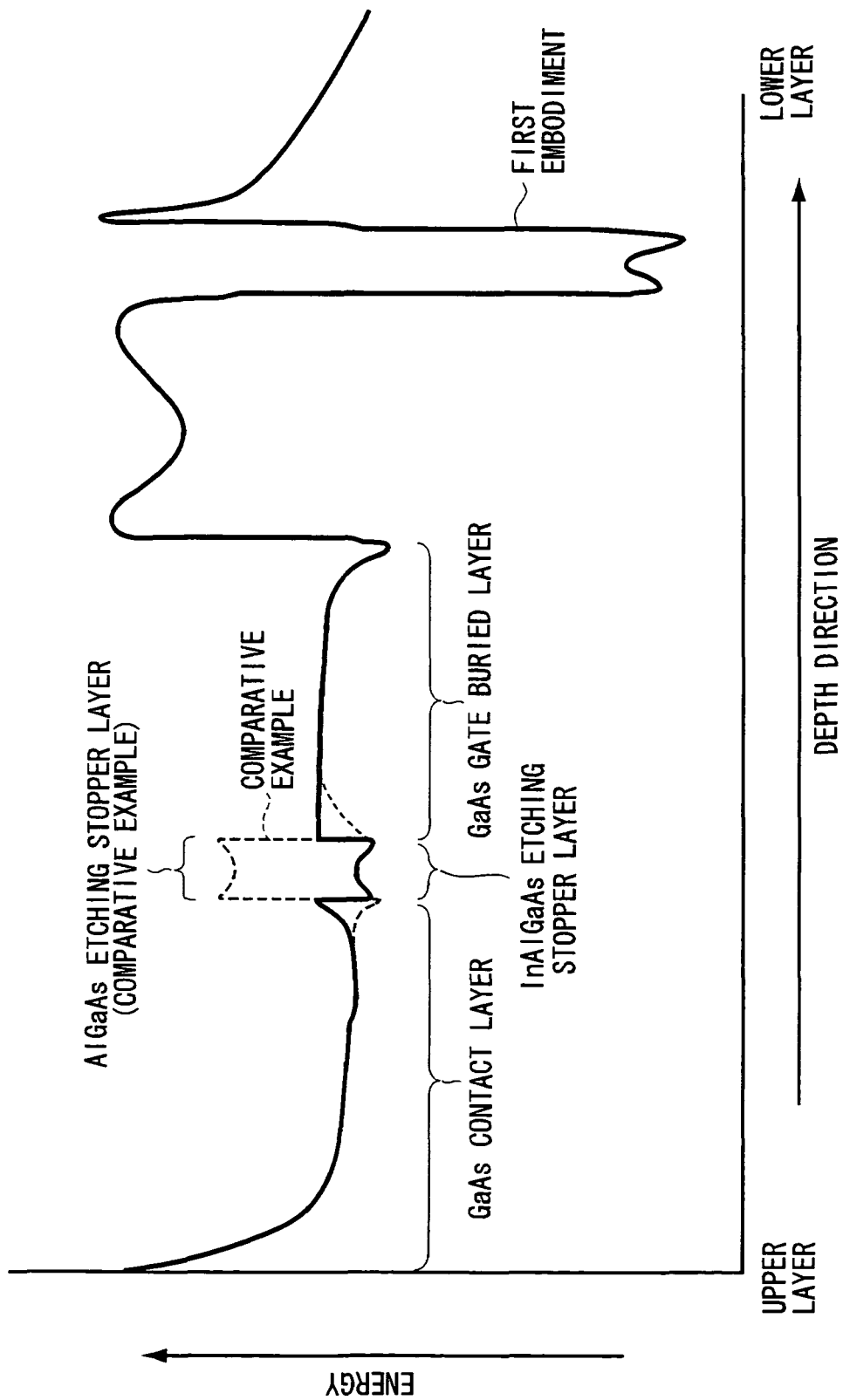
FIG. 3 is a schematic diagram showing a conduction band of an HEMT acquired by the manufacturing method for the semiconductor device according to the first embodiment.

Here, FIG. 3 shows a conduction band diagram of the HEMT acquired by the manufacturing method for a semiconductor device according to this embodiment. In the conduction band diagram in FIG. 3, the solid line indicates the band of this embodiment having an InAlGaAs layer (which is the $In_{0.2}Al_{0.2}Ga_{0.6}As$ layer) as an etching stopper layer, and the dotted line indicates a conventional band having an AlGaAs layer as an etching stopper layer. As shown in FIG. 3, according to this embodiment, an InAlGaAs layer (which is the $In_{0.2}Al_{0.2}Ga_{0.6}As$ layer) functioning as an etching stopper layer and two GaAs layers (which are the n-GaAs contact layer 110 and the undoped-GaAs gate buried layer 114) sandwiching the InAlGaAs layer form substantially flat bands in the conduction band. On the other hand, conventionally, the AlGaAs layer functioning as an etching stopper layer and two GaAs layers (which are the n-GaAs contact layer 110 and the undoped-GaAs gate buried layer 114) sandwiching the AlGaAs layer form largely varying bands in the conduction band, resulting in a discontinuous conduction band.

In this way, the conduction band diagram shown in FIG. 3 shows that, according to this embodiment, the electrons from the n-GaAs contact layer 110 can be easily conducted because the barrier caused by the conduction band discontinuity due to the etching stopper layer is low, and the increase in contact resistance is suppressed.

Figure 4:
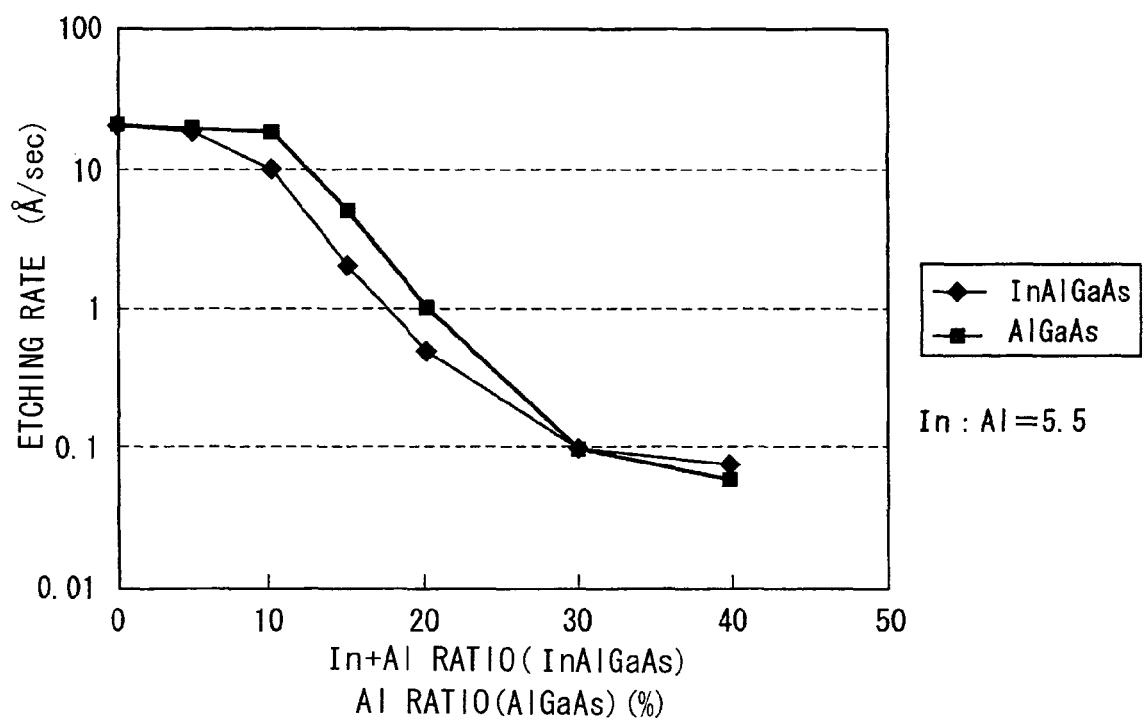
FIG. 4 is a diagram showing changes in etching rate according to the composition ratios of an InAlGaAs layer and an AlGaAs layer.

FIG. 4 shows changes in etching rates of an In AlGaAs layer and an AlGaAs layer according to the composition ratios thereof (where the composition ratio 0% is the etching rate of a GaAs layer). As shown in FIG. 4, in the case of an InAlGaAs layer, for example, when the In+Al ratio is 15%, the etching rate is 1/50 or lower with respect to the GaAs layer, which means that the InAlGaAs layer can sufficiently function as an etching stopper layer.

In the manufacturing method for the semiconductor device according to this embodiment, the n-GaAs contact layer 110 (which is the second GaAs layer) and the InAlGaAs etching stopper layer 112 are etched by using as an etchant a mixed solution of an organic acid or a organic salt, oxygenated water and water. In particular, the mixed solution as the etchant for etching the GaAs contact layer 110 (which is the second GaAs layer) can contribute to etching with high precision because the etching rate against the InAlGaAs etching stopper layer 112 is 1/50 or lower (preferably, 1/100 or lower) of that against the n-GaAs contact layer 110 (which is the second GaAs layer).

In other words, it is preferable that the etchant for etching the n-GaAs contact layer 110 (which is the second GaAs layer) is an etchant with the etching rate against the InAlGaAs etching stopper layer 112 being equal to 1/50 or lower (preferably, 1/100 or lower) of the etching rate against the n-GaAs contact layer 110 (which is the second GaAs layer).

Here, the etchant to be used for the etching is preferably a mixed solution of an organic acid or an organic salt, oxygenated water and water, and the pH may be 7 to 8 (about 7.5).

The organic acid or organic salt may be citric acid and tri-ammonium citrate for etching the n-GaAs contact layer 110 and may be, for example, a mixed solution of phosphoric acid, etcoxygenated water and water for etching the InAlGaAs etching stopper layer 112. The organic salt may be plural kinds of mixed salt.

In an etchant to be used for the etching, the mixing ratio of a mixed solution of the organic acid or the organic salt, oxygenated water and water may be 2 g:20 cc:2000 cc to 200 g:20 cc:2000 cc (more preferably 25.3 g:20 cc:2000 cc) when the organic salt is tri-ammonium citrate.

In the manufacturing method for a semiconductor device according to this embodiment, the undoped-GaAs gate buried layer 114 may be an AlGaAs gate buried layer containing a low level (15% or lower) of Al. Thus, the same manufacturing method as that using a GaAs gate buried layer can reduce the leak current to the undoped-GaAs gate buried layer 114.

Having described the manufacturing method for the semiconductor device according to this embodiment in which the layer functioning as both an electron donating layer and a Schottky layer is applied as the n-AlGaAs electron donating layer 116, the invention is not limited thereto. Layers having separate functions as an electron donating layer and a Schottky layer may be provided. More specifically, a lightly-doped n-AlGaAs Schottky layer (or undoped-AlGaAs Schottky layer) may be provided between the undoped-GaAs gate buried layer 114 and the n-AlGaAs electron donating layer 116.

Second Embodiment

Figure 5:
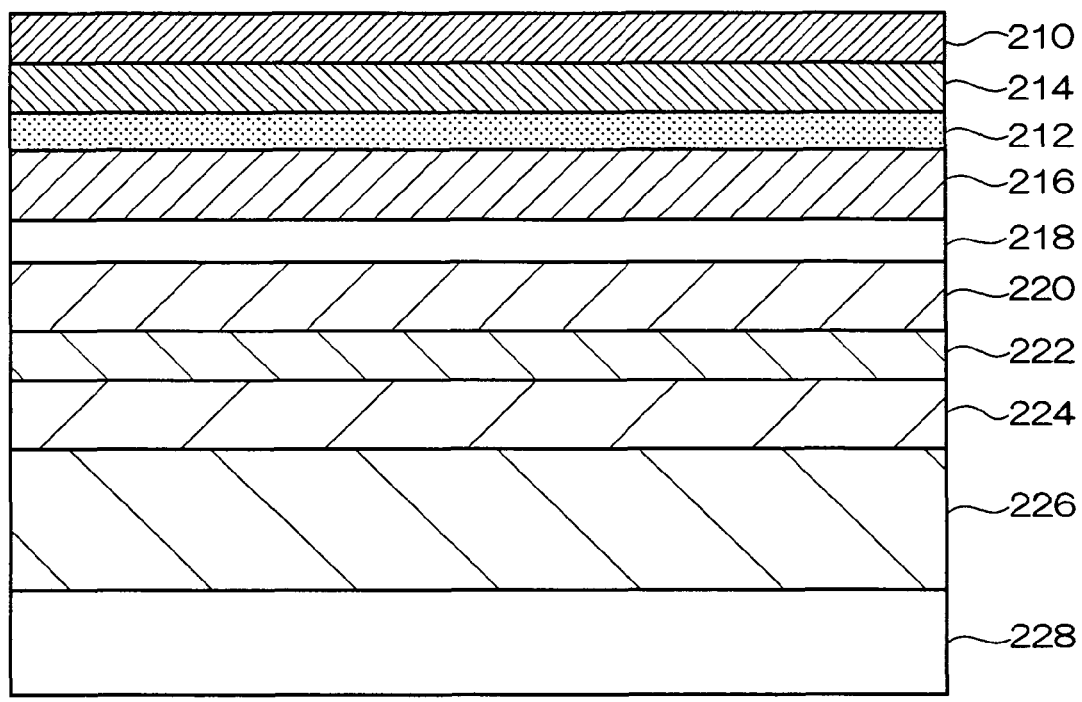
FIG. 5 is a schematic cross-sectional view for explaining a manufacturing process for a semiconductor device according to a second embodiment.
Figure 6:
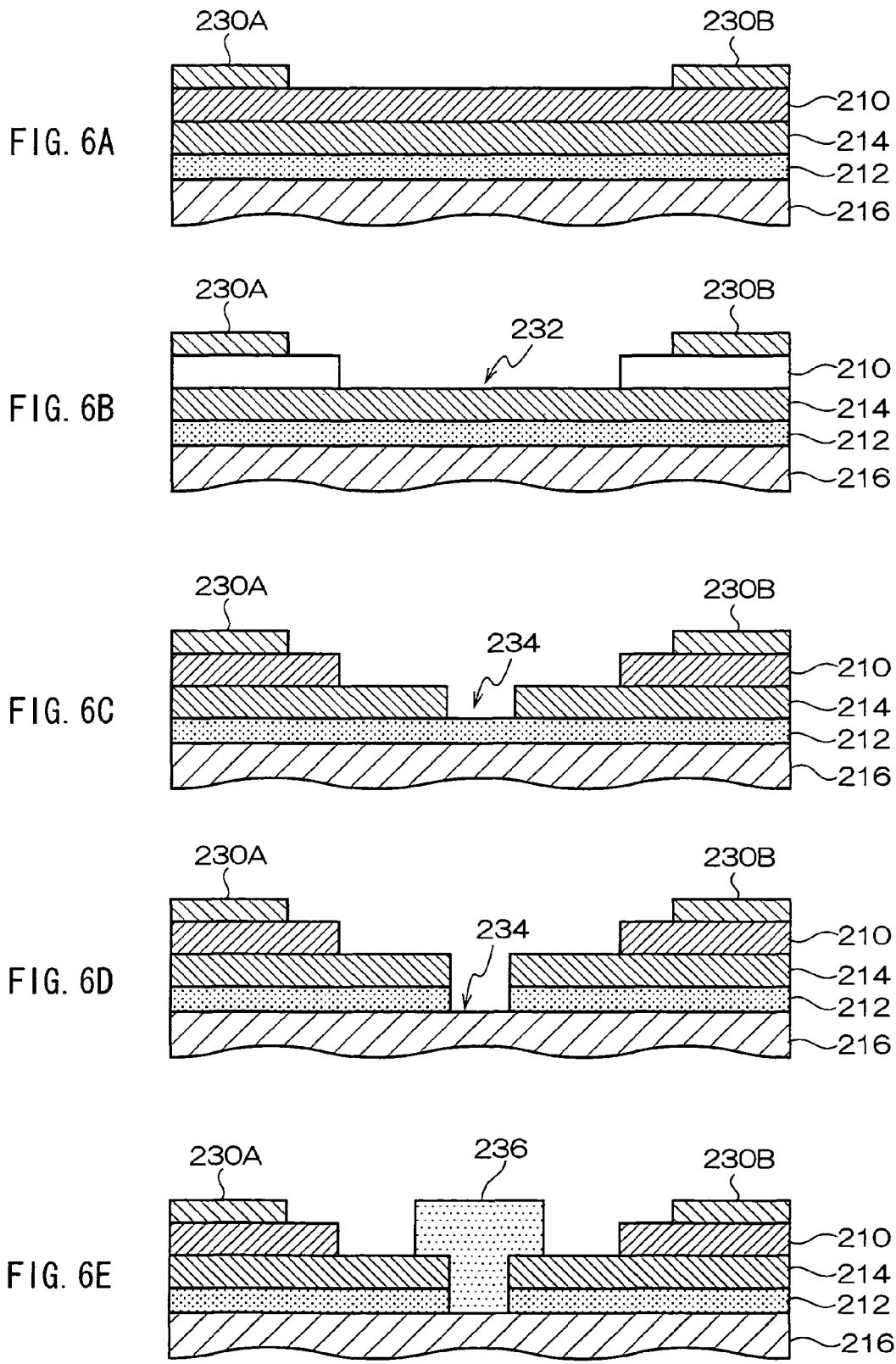
FIGS. 6A to 6E are process charts for explaining the manufacturing process for the semiconductor device according to the second embodiment.

Referring to FIGS. 5 and 6, a manufacturing method for a semiconductor device according to a second embodiment will be explained.

The manufacturing method for the semiconductor device according to the second embodiment is also a method for manufacturing an AlGaAs/InGaAs HEMT with a double recess structure, for example.

First of all, more specifically, as shown in FIG. 5, vapor deposition is used to form epitaxial layers on a GaAs substrate 228. The epitaxial layers are formed by epitaxial growth to include, from the uppermost layer side, an n-GaAs contact layer 210 (500 Å thick), an undoped-$Al_{0.25}Ga_{0.75}As$ gate buried layer 214 (200 Å thick, which is a second AlGaAs layer and will be called undoped-AlGaAs gate buried layer 214 below), an $In_{0.5}Al_{0.5}As$ etching stopper layer 212 (20 Å thick, which will be called InAlAs etching stopper layer 212 below), an n-$Al_{0.25}Ga_{0.75}As$ electron donating layer 216 (250 Å thick, which is a first AlGaAs layer and will be called n-AlGaAs electron donating layer 216), an undoped-$Al_{0.25}Ga_{0.75}As$ spacer layer 218 (30 Å thick), an $In_{0.2}Ga_{0.8}As$ channel layer 220 (100 Å thick), an undoped-$Al_{0.25}Ga_{0.75}As$ spacer layer 222 (50 Å thick), an n-$Al_{0.25}Ga_{0.75}As$ electron donating layer 224 (70 Å thick), and an undoped-$Al_{0.25}Ga_{0.75}As$ buffer layer 226 (2000 Å thick). The n-AlGaAs electron donating layer 216 is a layer functioning both as an electron donating layer and a Schottky layer.

Next, as shown in FIG. 6A, vacuum evaporation and/or the sputtering method is used to form two ohmic electrodes on the n-GaAs contact layer 210, which are used as a source electrode 230A and a drain electrode 230B.

Next, as shown in FIG. 6B, photolithography is used to provide a photoresist (not shown) having an opening pattern on the n-GaAs contact layer 210. Then, selective etching using a mixed solution (etchant) of di-ammonium hydrogen citrate or tri-ammonium citrate, oxygenated water and water is performed on the n-GaAs contact layer 210 between the source electrode 230A and the drain electrode 230B to form a wide recess 232 (which is a first through hole).

Next, as shown in FIG. 6C, photolithography is used to provide a photoresist (not shown) having an opening pattern both on the n-GaAs contact layer 210 and on the undoped-AlGaAs gate buried layer 214 exposed by the wide recess 232. Then, the undoped-AlGaAs gate buried layer 214 is etched by a mixed solution (etchant) of tri-ammonium citrate, oxygenated water and water to form an inner recess (which is a second through hole) which is smaller than the wide recess 232 within the wide recess 232. The mixing ratio of the mixed solution (etchant) is, for example, tri-ammonium citrate salt/ 25 g:oxygenated water/40 cc:water/2000 cc.

In the etching process, the InAlAs etching stopper layer 212 is little etched because the etching rate of the undoped-AlGaAs gate buried layer 214 is about 1000 Å/min while the etching rate of the InAlAs etching stopper layer 212 is 10 Å/min or lower, for example. Therefore, the InAlAs etching stopper layer 212 stops the etching.

Next, as shown in FIG. 6D, by keeping the photoresist (which is the photoresist for forming the inner recess), slight etching is performed on the InAlAs etching stopper layer 212 by using a dilute hydrochloric acid solution, whereby an inner recess 234 reachs the n-AlGaAs electron donating layer 216. The depth of the inner recess 234 as a result of the etching on the InAlAs etching stopper layer 212 corresponds to a third through hole.

Next, as shown in FIG. 6E, aluminum (Al) of 5000 Å thick is deposited using vacuum evaporation or sputtering, for example, and then the aluminum is lifted off to form a gate electrode 236, which is imbedded in the inner recess 234 and is also formed on the edge part of the inner recess 234 of the undoped-AlGaAs gate buried layer 214 (that is, on the undoped-AlGaAs gate buried layer 214 around the opening part of the inner recess 234).

In this way, the AlGaAs/InGaAs HEMT with a double recess structure is manufactured.

In the manufacturing method for the semiconductor device according to this embodiment which has been described above, the InAlAs layer (which is the InAlAs etching stopper layer 212) is provided between the two AlGaAs layers (which is the undoped-AlGaAs gate buried layer 214 and n-AlGaAs electron donating layer 216).

In addition, in this embodiment, the $In_{0.5}Al_{0.5}As$ layer is used as the InAlAs layer functioning as an etching stopper layer. A ratio of In:Al of the InAlAs etching stopper layer is preferably in a range of of 4:6 to 6:4 (more preferably, 4.5:5.5 to 5.5:4.5).

Because the InAlAs layer functioning as the etching stopper layer has a sufficiently low etching rate with respect to the undoped-AlGaAs gate buried layer 214 (which is the second AlGaAs layer), the InAlAs layer can fully exhibit the function as an etching stopper layer.

On the other hand, the InAlAs layer as an etching stopper layer has a sufficiently low barrier against the AlGaAs layers (which are the undoped-AlGaAs gate buried layer 214 and the n-AlGaAs electron donating layer 216) in the conduction of electrons, which can suppress the increase in contact resistance.

Here, an InAlAs layer containing In can have a sufficiently low barrier against an AlGaAs layer. However, because an InAlAs layer is a nonlattice matching layer, a threshold thickness at which dislocation does not occur (that is, the upper limit of thickness with which a layer having lattice matching as a result of epitaxial growth with good crystal can be obtained) exists and depends on a degree of mismatching with the lattice constant of a base. Therefore, the composition and thickness may not be selected freely. For example, according to this embodiment, the $In_{0.5}Al_{0.5}As$ layer has a composition ratio of In of 50% (In+Al=100%). The threshold thickness in this case is about 20 Å. As the composition ratio of In increases, the contact resistance decreases with respect to the AlGaAs layer. On the other hand, because the threshold thickness decreases, the thickness providing the sufficient function as an etching stopper layer may not be obtained. Therefore, in this embodiment, the InAlAs layer having the above-mentioned predetermined composition ratio allows lattice matching and can be formed in thickness allowing the sufficient function as an etching stopper layer (more specifically, such as 15 Å or thicker), and the contact resistance can be reduced.

Therefore, the etching stopper layer can be used to perform selective etching with high precision between two AlGaAs layers and can suppress the increase in contact resistance. As a result, the etching depth can be controlled with high precision, and a device with a low parasitic resistance (more specifically, such as a device with a low parasitic resistance between the n-GaAs contact layer 210 and the n-AlGaAs electron donating layer 216) can be obtained.

Figure 7:
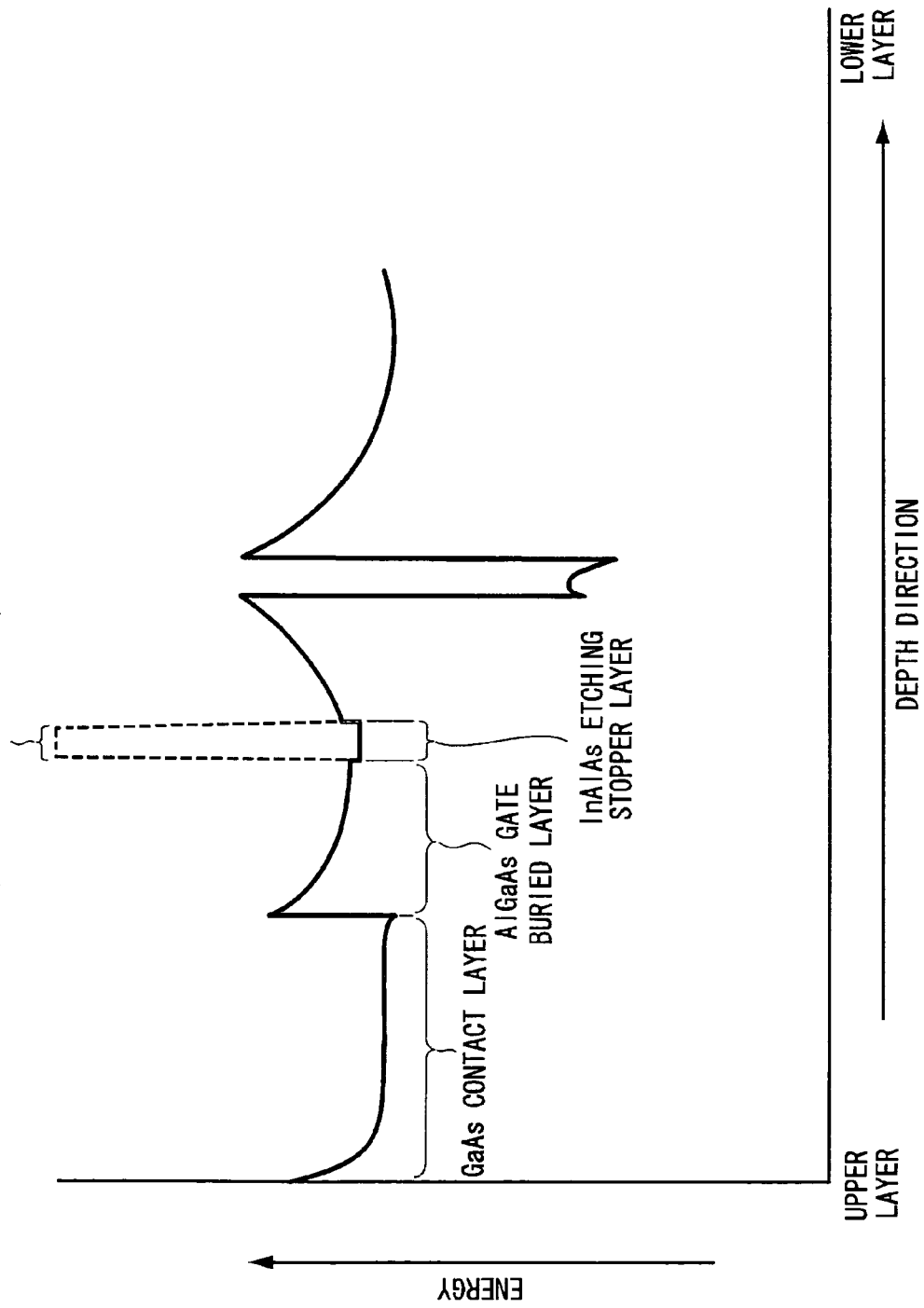
FIG. 7 is a schematic diagram showing a conduction band of an HEMT acquired by the manufacturing method for a semiconductor device according to the second embodiment.

Here, FIG. 7 shows a conduction band diagram of the HEMT acquired by the manufacturing method for a semiconductor device according to this embodiment. In the conduction band diagram in FIG. 7, the solid line indicates the band of this embodiment having an InAlAs layer (which is the $In_{0.5}Al_{0.5}As$ layer) as an etching stopper layer, and the dotted line indicates a conventional band having an AlAs layer as an etching stopper layer. As shown in FIG. 7, according to this embodiment, an InAlAs layer (which is $In_{0.5}Al_{0.5}As$ layer) functioning as an etching stopper layer and two AlGaAs layers (which are the undoped-AlGaAs gate buried layer 214 and the n-AlGaAs electron donating layer 216) sandwiching the InAlAs layer form substantially flat bands in the conduction band. On the other hand, conventionally, the AlAs layer functioning as an etching stopper layer and two AlGaAs layers (which are the undoped-AlGaAs gate buried layer 214 and the n-AlGaAs electron donating layer 216) sandwiching the AlAs layer form largely varying bands in the conduction band, resulting in a discontinuous conduction band.

In this way, the conduction band diagram shown in FIG. 7 shows that, according to this embodiment, the electrons from the n-GaAs contact layer 210 can be easily conducted because the barrier caused by the conduction band discontinuity due to the etching stopper layer is low, and the increase in contact resistance is suppressed.

Giving a supplementary explanation, normally, an AlAs layer or $Al_xGa_{1-x}As$ (x>0.7) layer containing a high level of Al is used in a selective etching with respect to $Al_xGa_{x-1}As$ (0.15<x<0.35) layer, and the conduction band discontinuity against the $Al_xGa_{x-1}As$ (0.15<x<0.35) layer can be significantly suppressed low. However, the ground level of the conduction band of an $Al_xGa_{1-x}As$ (x>0.43) layer is an X point, whereas the ground level of the conduction band of other materials is a $\Gamma$ point. It is known that, when the $Al_xGa_{1-x}As$ (x>0.43) layer is remarkably thin, the barrier at the $\Gamma$ point becomes dominant. Therefore, the conduction band discontinuity at the $\Gamma$ point must be taken into consideration. From the viewpoint of this, for example, it should be considered that the conduction band discontinuity of the AlAs layer against the $Al_xGa_{x-1}As$ (x=0.25) layer is the order of 1 eV.

In the manufacturing method for the semiconductor device according to this embodiment, the n-GaAs contact layer 210 and the undoped-AlGaAs gate buried layer 214 (which is the second AlGaAs layer) are etched by using as an etchant a mixed solution of an organic acid or a organic salt, oxygenated water and water. In particular, the mixed solution as the etchant for etching the undoped-AlGaAs gate buried layer 214 (which is the second AlGaAs layer) can contribute to etching with high precision because the etching rate against the InAlAs etching stopper layer 212 is 1/500 or lower of that against the undoped-AlGaAs gate buried layer 214 (which is the second AlGaAs layer).

In other words, it is preferable that the etchant for etching the undoped-AlGaAs gate buried layer 214 (which is the second AlGaAs layer) is an etchant with the etching rate against the InAlAs etching stopper layer 212 being equal to 1/500 or lower of the etching rate against the undoped-AlGaAs gate buried layer 214 (which is the second AlGaAs layer). Because the other preferable characteristics of the etchant are the same as those of the first embodiment, the description thereon will be omitted.

Having described the manufacturing method for the semiconductor device according to this embodiment in which the layer functioning as both an electron donating layer and a Schottky layer is applied as the n-AlGaAs electron donating layer 216, the invention is not limited thereto. Layers having separate functions as an electron donating layer and a Schottky layer may be provided. More specifically, a low-doped n-AlGaAs Schottky layer (or undoped-AlGaAs Schottky layer) may be provided between the $In_{0.5}Al_{0.5}As$ etching stopper layer 212 and the n-AlGaAs electron donating layer 216.

Having described the manufacturing methods for the semiconductor device according to the embodiments in which an HEMT is manufactured, the invention is not limited thereto. The invention is also applicable to a manufacturing method for a semiconductor device (such as a MESFET (or Metal-Semiconductor Field Effect Transistor)) having continuous two GaAs layers or two AlGaAs layers and the interface between the layers to be etched. Alternatively, the invention is also applicable to a manufacturing method for a semiconductor device (or an electronic device) using electrons as conduction carriers. More specifically, for example, in order to perform etching with high precision on the interface between an undoped-GaAs layer and an n-GaAs layer, the first embodiment is effective, that is, it is effective to insert an InAlGaAs layer between the layers and perform etching processing.

Although various exemplary embodiments have been shown and described, the invention is not limited to the embodiments shown. Therefore, the scope of the invention is intended to be limited solely by the scope of the claims that follow.

What is claimed is:

1. A semiconductor device manufacturing method, comprising:
   providing a laminated member in which at least an AlGaAs electron donating layer or an AlGaAs Schottky layer, a GaAs gate-buried layer, an InAlGaAs etching stopper layer, and a GaAs contact layer are laminated on or above a substrate in this order;
   etching the GaAs contact layer to form a first through hole;
   etching the InAlGaAs etching stopper layer to form a second through hole having approximately the same size as the first through hole;
   etching the GaAs gate-buried layer to form a third through hole in the first and second through holes, the third through hole being smaller than the first through hole; and
   forming an electrode in the first and second through holes, wherein
   a ratio of In:Al of the InAlGaAs etching stopper layer is in a range of approximately 4:6 to approximately 6:4 and a ratio of (In+Al):Ga of the InAlGaAs etching stopper layer is in a range of approximately 1.5:8.5 to approximately 5:5.

2. A semiconductor device manufacturing method according to claim 1, wherein an etchant for etching the GaAs contact layer is a mixed liquid of an organic acid or a salt thereof, oxygenated water and water.

3. A semiconductor device manufacturing method according to claim 1, wherein an etchant for etching the GaAs contact layer is an etchant with which an etching rate of the InAlGaAs etching stopper layer is equal to or less than 1/50 of an etching rate of the GaAs contact layer.

4. A semiconductor device manufacturing method according to claim 1, wherein the GaAs gate-buried layer is an undoped GaAs gate-buried layer or an AlGaAs gate-buried layer including Al at a low concentration.

* * * * *